United States Patent
Moll

(10) Patent No.: US 9,852,081 B2
(45) Date of Patent: Dec. 26, 2017

(54) STLB PREFETCHING FOR A MULTI-DIMENSION ENGINE

(71) Applicant: Laurent Moll, San Jose, CA (US)

(72) Inventor: Laurent Moll, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 814 days.

(21) Appl. No.: 13/969,562

(22) Filed: Aug. 17, 2013

(65) Prior Publication Data

US 2014/0052956 A1 Feb. 20, 2014

Related U.S. Application Data

(60) Provisional application No. 61/684,705, filed on Aug. 18, 2012.

(51) Int. Cl.
*G06F 12/02* (2006.01)
*G06F 12/08* (2016.01)
(Continued)

(52) U.S. Cl.
CPC ...... *G06F 12/1036* (2013.01); *G06F 12/0207* (2013.01); *G06F 12/0215* (2013.01); *G06F 12/0811* (2013.01); *G06F 12/1027* (2013.01); *G06F 12/1081* (2013.01); *G06F 17/5009* (2013.01); *G06F 2212/681* (2013.01)

(58) Field of Classification Search
CPC ............ G06F 12/0207; G06F 12/0215; G06F 12/0811; G06F 12/1027; G06F 12/1036; G06F 12/1081; G06F 17/5009; G06F 2212/681

See application file for complete search history.

(56) References Cited

U.S. PATENT DOCUMENTS

| 4,525,780 A | 6/1985 | Bratt et al. |
| 4,914,577 A | 4/1990 | Stewart et al. |

(Continued)

FOREIGN PATENT DOCUMENTS

| EP | 0495167 A2 | 7/1992 |
| EP | 0518575 A1 | 12/1992 |

(Continued)

OTHER PUBLICATIONS

ALTERA, "SOPC Builder User Guide", Dec. 2010, chapter 11, pp. 1-25. [retrieved May 14, 2014]. Retrieved from the Internet: https://www.altera.com/content/dam/altera-www/global/en_US/pdfs/literature/ug/ug_sopc_builder.pdf.

(Continued)

*Primary Examiner* — Aracelis Ruiz
(74) *Attorney, Agent, or Firm* — Muncy, Geissler, Olds & Lowe,

(57) ABSTRACT

A multi-dimension engine, connected to a system TLB, generates sequences of addresses to request page address translation prefetch requests in advance of predictable accesses to elements within data arrays. Prefetch requests are filtered to avoid redundant requests of translations to the same page. Prefetch requests run ahead of data accesses but are tethered to within a reasonable range. The number of pending prefetches are limited. A system TLB stores a number of translations, the number being relative to the dimensions of the range of elements accessed from within the data array.

22 Claims, 8 Drawing Sheets

(51) Int. Cl.
*G06F 12/10* (2016.01)
*G06F 17/50* (2006.01)
*G06F 12/1036* (2016.01)
*G06F 12/0811* (2016.01)
*G06F 12/1027* (2016.01)
*G06F 12/1081* (2016.01)

(56) References Cited

U.S. PATENT DOCUMENTS

| | | | |
|---|---|---|---|
| 5,598,553 A * | 1/1997 | Richter | G06F 11/3648 |
| | | | 711/209 |
| 5,694,567 A | 12/1997 | Bourekas et al. | |
| 5,701,448 A | 12/1997 | White | |
| 5,752,274 A | 5/1998 | Garibay, Jr. et al. | |
| 6,065,113 A | 5/2000 | Shiell et al. | |
| 6,195,735 B1 | 2/2001 | Krueger et al. | |
| 6,212,603 B1 | 4/2001 | McInerney et al. | |
| 6,289,138 B1 * | 9/2001 | Yip | G06F 9/3879 |
| | | | 382/307 |
| 6,389,514 B1 | 5/2002 | Rokicki | |
| 6,560,664 B1 | 5/2003 | Carlson | |
| 6,574,698 B1 | 6/2003 | Dhong et al. | |
| 6,629,207 B1 * | 9/2003 | Yoshioka | G06F 12/0864 |
| | | | 711/125 |
| 6,675,280 B2 | 1/2004 | Cooksey et al. | |
| 6,735,688 B1 | 5/2004 | Upton et al. | |
| 6,819,326 B2 * | 11/2004 | Jaspers | G06F 12/0215 |
| | | | 345/520 |
| 7,099,318 B2 | 8/2006 | Harriman | |
| 7,143,225 B1 | 11/2006 | Tischler et al. | |
| 7,797,494 B2 | 9/2010 | Kimura | |
| 7,962,715 B2 | 6/2011 | Ware | |
| 8,095,931 B1 * | 1/2012 | Chen | G06F 9/5016 |
| | | | 711/136 |
| 8,185,696 B2 | 5/2012 | Vuletic et al. | |
| 8,225,070 B2 | 7/2012 | Okawara et al. | |
| 8,250,307 B2 | 8/2012 | Arimilli et al. | |
| 8,447,837 B2 * | 5/2013 | Devanneaux | G06F 17/30902 |
| | | | 709/203 |
| 9,141,556 B2 | 9/2015 | Moll et al. | |
| 9,396,130 B2 | 7/2016 | Moll et al. | |
| 9,465,749 B2 | 10/2016 | Moll et al. | |
| 2002/0038401 A1 | 3/2002 | Zaidi et al. | |
| 2003/0033510 A1 | 2/2003 | Dice | |
| 2003/0105940 A1 | 6/2003 | Cooksey et al. | |
| 2003/0126371 A1 | 7/2003 | Venkatraman | |
| 2003/0135685 A1 | 7/2003 | Cowan | |
| 2004/0034718 A1 | 2/2004 | Goldenberg et al. | |
| 2004/0176942 A1 | 9/2004 | Chochia et al. | |
| 2004/0215649 A1 | 10/2004 | Whalen et al. | |
| 2004/0215849 A1 | 10/2004 | Graham et al. | |
| 2004/0260909 A1 | 12/2004 | Lee et al. | |
| 2005/0108497 A1 | 5/2005 | Bridges et al. | |
| 2005/0160250 A1 | 7/2005 | Yoshimi | |
| 2006/0149981 A1 | 7/2006 | Dieffenderfer et al. | |
| 2006/0179175 A1 * | 8/2006 | Bockhaus | G06F 12/0862 |
| | | | 710/22 |
| 2006/0184804 A1 | 8/2006 | Varma et al. | |
| 2007/0044106 A2 | 2/2007 | Kissell et al. | |
| 2007/0067505 A1 | 3/2007 | Kaniyur et al. | |
| 2007/0092018 A1 | 4/2007 | Fonseka et al. | |
| 2008/0028181 A1 | 1/2008 | Tong et al. | |
| 2008/0040584 A1 * | 2/2008 | Hansen | G06F 9/30014 |
| | | | 712/222 |
| 2008/0209130 A1 | 8/2008 | Kegel et al. | |
| 2008/0209173 A1 | 8/2008 | Evers et al. | |
| 2009/0019252 A1 | 1/2009 | Burns et al. | |
| 2009/0164998 A1 | 6/2009 | Stevens et al. | |
| 2009/0235278 A1 | 9/2009 | Prakash | |
| 2010/0037028 A1 | 2/2010 | Shen et al. | |
| 2010/0057997 A1 | 3/2010 | Moyer | |
| 2010/0070708 A1 | 3/2010 | Maruyama | |
| 2010/0100682 A1 * | 4/2010 | Guthrie | G06F 12/0897 |
| | | | 711/122 |
| 2010/0153686 A1 | 6/2010 | Frank | |
| 2010/0223505 A1 | 9/2010 | Andreev et al. | |
| 2010/0262787 A1 | 10/2010 | Arimilli et al. | |
| 2010/0306503 A1 | 12/2010 | Henry et al. | |
| 2010/0318707 A1 | 12/2010 | Tanaka et al. | |
| 2011/0010521 A1 | 1/2011 | Wang et al. | |
| 2011/0040941 A1 | 2/2011 | Diefendorff | |
| 2011/0072235 A1 | 3/2011 | Deming et al. | |
| 2011/0074802 A1 * | 3/2011 | Nickolls | G06T 1/60 |
| | | | 345/564 |
| 2011/0145542 A1 | 6/2011 | Morrow | |
| 2011/0219208 A1 | 9/2011 | Asaad et al. | |
| 2012/0011342 A1 | 1/2012 | Ingle et al. | |
| 2012/0066455 A1 | 3/2012 | Punyamurtula et al. | |
| 2012/0117301 A1 | 5/2012 | Wingard | |
| 2012/0124260 A1 | 5/2012 | Kothamasu | |
| 2012/0131306 A1 * | 5/2012 | Bratt | G06F 12/1027 |
| | | | 711/205 |
| 2013/0227245 A1 | 8/2013 | Gupta et al. | |
| 2013/0346703 A1 | 12/2013 | McCauley et al. | |

FOREIGN PATENT DOCUMENTS

| | | |
|---|---|---|
| EP | 1031919 B1 | 10/2008 |
| TW | 200951980 A | 12/2009 |
| WO | 2007079192 A2 | 7/2007 |

OTHER PUBLICATIONS

International Search Report and Written Opinion—PCT/US2013/055451—ISA/EPO—dated May 23, 2014.

\* cited by examiner

| 0 | 4 | 8 | 12 | 16 | 20 |
|---|---|---|---|---|---|
| 32 | 36 | 40 | 44 | 48 | 52 |
| 64 | 68 | 72 | 76 | 80 | 84 |
| 96 | 100 | 104 | 108 | 112 | 116 |
| 128 | 132 | 136 | 140 | 144 | 148 |

110

| 0 | 4 | 8 | 12 | 16 |
|---|---|---|---|---|
| 32 | 36 | 40 | 44 | 48 |
| 64 | 68 | 72 | 76 | 80 |
| 96 | 100 | 104 | 108 | 112 |
| 128 | 132 | 136 | 140 | 144 |
| 160 | 164 | 168 | 172 | 176 |

STLB PREFETCHING FOR A MULTI-DIMENSION ENGINE

CROSS-REFERENCE AND RELATED APPLICATIONS

This application claims priority under 35 USC 119 from U.S. Provisional Application Ser. No. 61/684705 filed on Aug. 18, 2012, titled SYSTEM TRANSLATION LOOK-ASIDE BUFFER WITH REQUEST-BASED ALLOCATION AND PREFETCHING, the entire disclosure of which is incorporated herein by reference. Furthermore, this application is related to U.S. Non-Provisional patent application Ser. No. 13/969,425 filed on Aug. 16, 2013 and tilted SYSTEM TRANSLATION LOOK-ASIDE BUFFER WITH REQUEST-BASED ALLOCATION AND PREFETCHING, U.S. Non-Provisional patent application Ser. No. 13/969,451 filed on Aug. 16, 2013 and tilted SYSTEM TRANSLATION LOOK-ASIDE BUFFER INTEGRATED IN AN INTERCONNECT, and U.S. Non-Provisional patent application Ser. No. 13/969,559 filed on Aug. 17, 2013 and tilted DMA ENGINE WITH STLB PREFETCH CAPABILITIES AND TETHERED PREFETCHING, each of which is incorporated herein by reference.

FIELD OF THE INVENTION

The invention disclosed herein is in the field of computer system design, particularly for system-on-chip semiconductor devices.

BACKGROUND

Memory Management Units (MMUs) are commonly used in microprocessors to provide virtual memory capability. When virtual memory is enabled, software executing on the processor only sees and uses Virtual Addresses (VA). The MMU is tasked to convert a VA into a Physical Address (PA) that can then be used inside and outside the processor. Using virtual memory has a number of advantages including being able to give the illusion of more memory than is actually available, giving access to a physical memory system that has more address bits than are supported by the software, and protection of the physical memory with varying access rights.

Some modern systems that support virtualization have two levels of translation between VAs and PAs. The first level is similar to that found on non-virtualized system, but the PA is not the final PA. It may be called Intermediate Physical Address (IPA) or Guest Physical Address (GPA). The second level maps that intermediate address into a final PA. In these systems, for any software running on the processor, the first level or the second level or both may be enabled.

In general, the virtual address space is divided into pages. Pages are commonly a few kilobytes, though other page sizes can be used. Systems often support multiple page sizes from a few kilobytes to a few megabytes or even gigabytes to increase translation efficiency. All addresses within a page are translated in the same fashion and all the access right information is the same. The translation between VAs and PAs is done through a (often multi-level) page table. The process of going through the page table to translate a VA into a PA is often called walking as it comprises a sequence of table lookups.

The MMU often comprises two parts. The first part is called the Translation Look-aside Buffer (TLB). It caches translations so that they are very quickly accessible to the processor, so that for translations that are cached, the processor can execute with little delay. The second part is the walker, which walks the page tables when the TLB does not contain a translation. In some systems, there may be more caching between the TLB and the walker. For instance, the TLB may have 2 levels of caching. The walker may itself contain a cache.

A System MMU (SMMU) mirrors the use of the MMU, but applied to I/O devices instead of microprocessors. With an SMMU, I/O devices can also take advantage of the benefits of virtual memory and virtualization. Like an MMU, an SMMU operates on pages and uses page tables to calculate translations. In some cases, an SMMU may use the same page table formats as the MMU of a processor to which the SMMU's I/O device is connected. In that case, the page tables may be shared between the MMU and the SMMU.

Like an MMU, an SMMU often consists of a walker and a System TLB (STLB), acting as a cache for translations to help in keeping peak performance of I/O device. In some cases, multiple STLBs can share a single walker for efficiency reasons.

In most cases, TLBs inside processors are tightly integrated with the processor because physical addresses are needed inside the processor (e.g. for caches that may be visible to cache coherency). In contrast, an STLB does not have to be integrated inside an I/O device. It may be placed outside the I/O device without any negative impact. In many cases, multiple I/O devices may share a single STLB. An STLB just needs to be between the source and the destination of a data request to provide translation services. In designs that have an interconnect, STLBs may be placed between the I/O devices and the interconnect, or in the interconnect, close to the I/O devices.

It is common in many data processing fields to access a data set in a way that does not follow its memory organization. In particular, two-dimensional arrays are typically laid out in memory so that accesses along one of the dimensions are sequential in memory. However, accessing that same array along the other dimension requires non-sequential accesses to memory. Fields where this type of accesses occur include video and image capture and display, 2D processing, as well as other fields with matrix-based data processing. To represent an array with two or more dimensions in a system (for example a 2D surface) with a memory organized as a linear address space, if the address space is divided into translated pages and if the array dimensions are not much smaller than the page size, certain severe performance-hindering problems arise. Every data element or atomic unit of surface data (for example a pixel) will access a different page in either the reading or the writing step of the rotation. This at least causes a flurry of STLB misses at the beginning of the surface. If the number of rows being accessed exceeds the number of mappings in the STLB cache then every pixel in the whole surface causes a STLB miss.

SUMMARY OF THE INVENTION

The disclosed invention is a multi-dimension engine that can be connected to a memory through an SMMU with a STLB. The multi-dimension engine accesses data for surfaces or other types of data arrays. It can access data in a non-linear fashion. The multi-dimension engine sends requests for translations of addresses within pages in advance of later requests to access data elements within the page, thereby minimizing or avoiding stalling for translation fetching when the data element access request is sent. Such data-less requests for translations are known as STLB prefetch requests. The multi-dimension engine accesses groups of data elements that use only a number of mappings that can be contained within the capacity of the STLB, thereby reducing the total number of translation cache misses.

BRIEF DESCRIPTION OF THE DRAWINGS

FIG. 2 shows the correspondence of addresses of data within a rotated line in accordance with the present invention.

DETAILED DESCRIPTION

Figure 1:
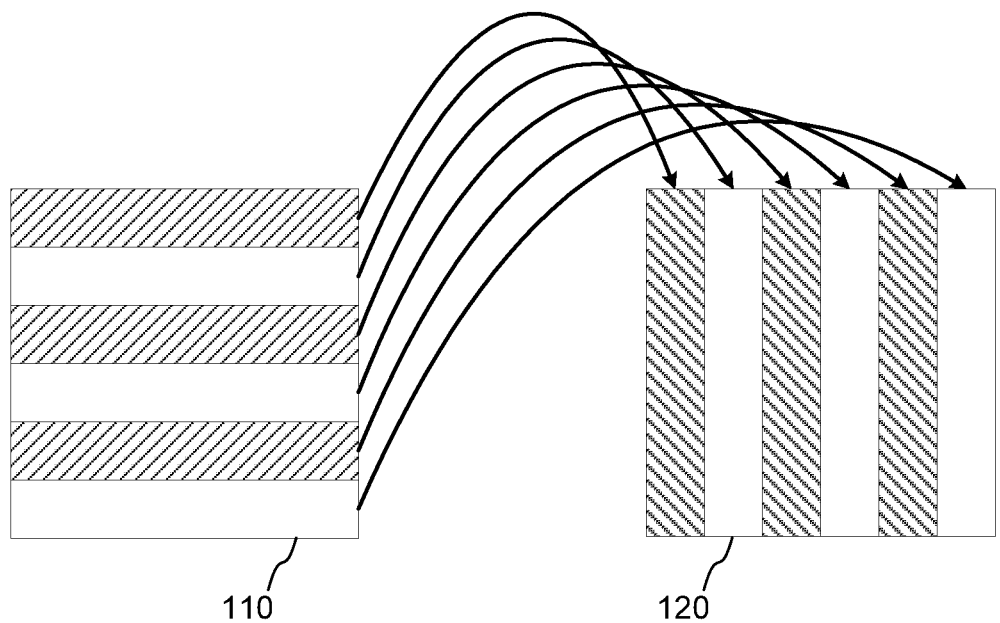
FIG. 1 illustrates the rotation of a surface in accordance with the present invention.

A multi-dimension engine such as a rotation engine takes a 2D surface and writes it with x-y coordinates reversed. FIG. 1 depicts an array of surface data in memory. Source surface 110 has its coordinates reversed to create destination surface 120.

According to an aspect of the invention, the memory address of each pixel of a surface, based on its coordinates, is given by the following formula:

Addr=BASE+y*WIDTH+x*PIX_SIZE where:

x and y are the coordinates of the pixel within the surface;

BASE is the base address of the surface;

WIDTH is the distance (in bytes) between the start of a row and the start of the next one; and PIX_SIZE is the size of a pixel in bytes (typically 2 or 4 bytes).

According to other aspects of the invention, other formulas describe the arrangement of pixels at memory addresses.

Source surface 110 and destination surface 120 need not have the same parameters (BASE, WIDTH, PIX_SIZE).

A problem for conventional multi-dimension engines is that while one surface can be stepped through in incremental addresses of adjacent data (except potentially at the end of a row), the other surface must be stepped through in addresses with relatively large steps. This is shown in FIG. 2 where the mapping of pixel addresses is source surface (0)=>destination surface (0)

source surface (32)=>destination surface (4)

source surface (64)=>destination surface (8)

source surface (96)=>destination surface (12)

source surface (128)=>destination surface (16)

The destination surface is written in incremental addresses of adjacent data (with PIX_SIZE=4 bytes) while the SRC surface is read with big jumps between pixels.

Memories, such as dynamic random access memories (DRAMs), where surfaces might be shared between writing and reading agents are not efficient when accessing small units of data. In the example of FIG. 2, the writing of the destination surface can be done efficiently, but the reading of the source surface cannot.

This is traditionally solved in 2 steps:

(1) Fetching from the source surface in larger blocks (2) Adding some intermediate storage to the multi-dimension engine so that the unneeded data from the large block fetch is kept for enough time so that it is still in the intermediate storage when the multi-dimension engine needs it.

Figure 3:
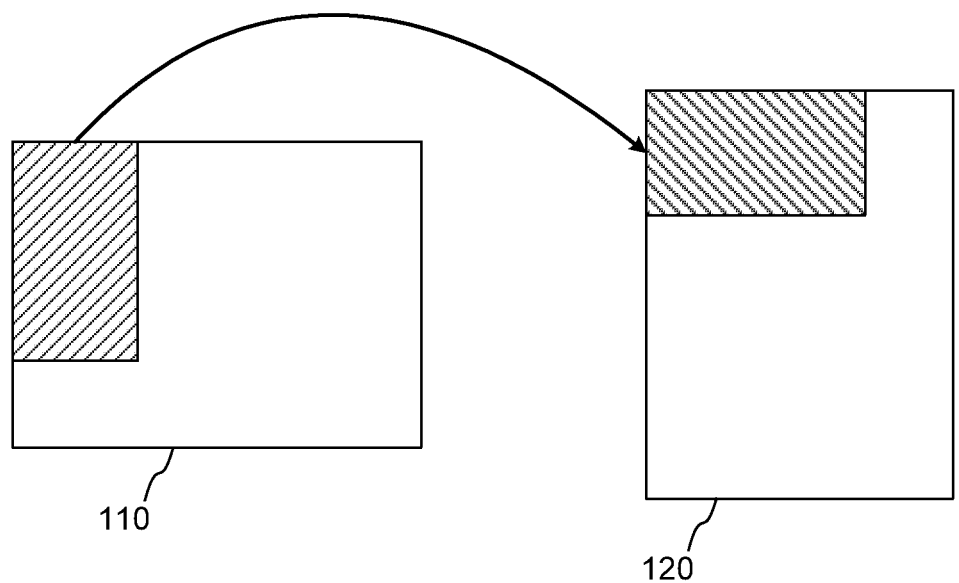
FIG. 3 shows reading groups of pixels from a source and writing them to a destination in accordance with the present invention.

In FIG. 3, the multi-dimension engine reads from SRC in groups of contiguous pixels (in the example, groups of 2). Then it uses on for writing directly to DST while the rest is temporarily stored. The width and height of the blocks can be chosen to maximize the use of DRAM while minimizing the buffer needed.

DRAMs typically behave near optimally for 64-256 byte bursts, so a rectangular access region might be 16-128 pixels on one side. To reduce buffering, one dimension of the rectangle may be reduced.

Another problem arises when the addresses accessed by the multi-dimension engine are virtual addresses.

In a virtual addressing system, memory is composed of pages (a typical size being 4 KB). The mapping of virtual addresses (VA) to physical addresses (PA) tends to be irregular, so that pixels at adjacent VAs, that cross a page boundary, might be far apart in physically-addressed memory.

Surfaces to be rotated within chips may exceed a WIDTH of 4 KB with PIX_SIZE of 4B. With virtually addressed page sizes of 4 KB, this means that a single row of pixels in a surface spans more than one page. As a consequence, pixels within a column are not on the same page. Even with WIDTH smaller than the page size, the page locality of pixels in a column can be low enough to cause substantial performance problem due to STLB misses.

Figure 4:
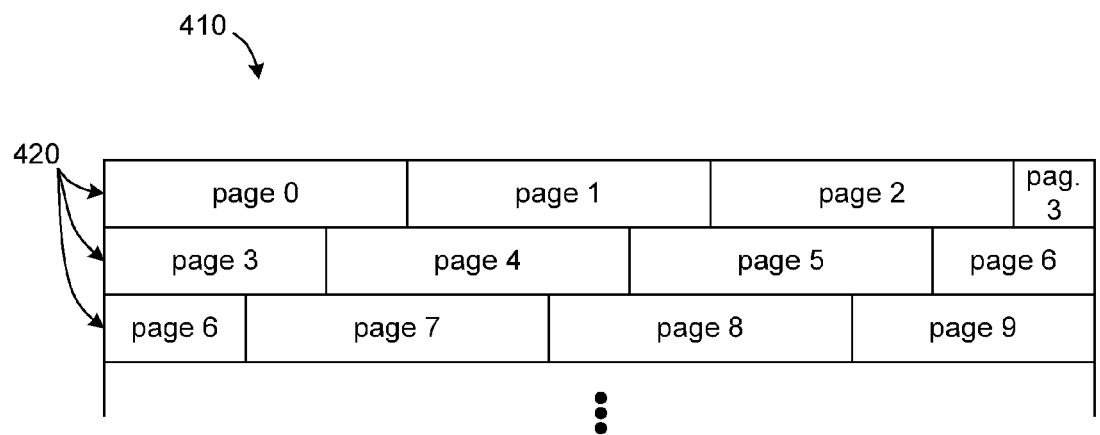
FIG. 4 shows the mapping of rows of a surface to memory pages in accordance with the present invention.

FIG. 4 shows surface 410 with 3200 pixels width and 4B PIX_SIZE. Each row 420 of the surface uses WIDTH=3200*4B=12.8 kB. With 4 KB pages, each row uses 3.125 pages. The pixels of the first column are in pages 0, 3, 6, and so forth.

In a virtual memory system, the multi-dimension engine is connected to the memory through a system memory management unit (SMMU). The SMMU takes VAs and converts them to PAs suitable for memory.

Figure 5:
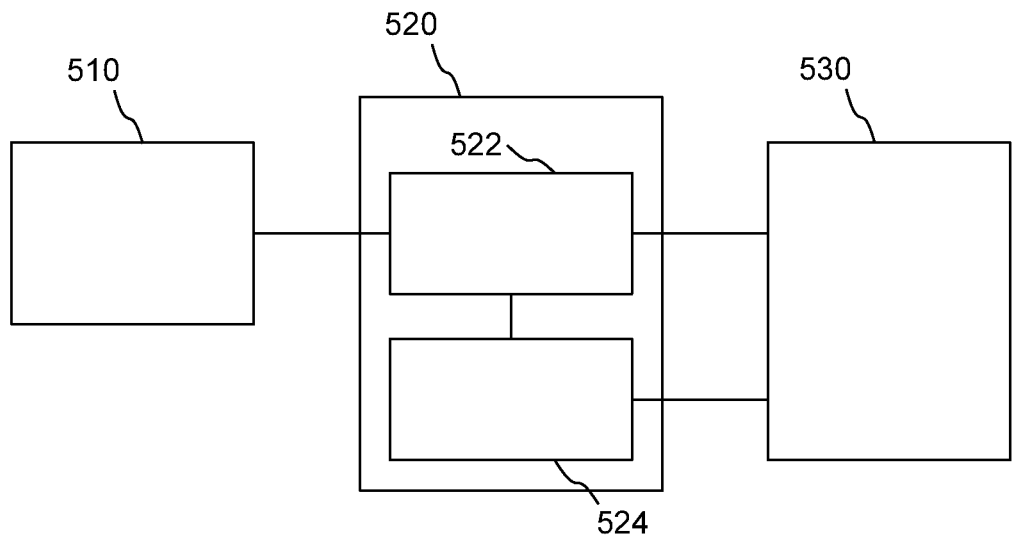
FIG. 5 illustrates the arrangement of a rotation engine, SMMU, and memory in accordance with the present invention.

According to an aspect of the invention, as shown in FIG. 5, multi-dimension engine 510 is connected through SMU 520 to memory 530. SMMU 520 comprises system translation look-aside buffer (STLB) 522 and walker 524. STLB 522 keeps track of recent VA to PA translations. Walker 524 computes or looks up a translation from a translation table in memory when a translation for a requested VA is not present in STLB 522.

Walker 524 takes from 2 to more than 20 memory accesses to resolve a translation. 2 memory accesses are enough for a small VA space. 20 or more memory accesses are required for large VA spaces, such as ones represented with 64 bits, and "nested paging", due to the extra layer of virtualization.

Because of this, the memory access traffic generated by walker 524 during a traversal of surface 410 in the vertical direction far exceeds the traffic to access the pixels themselves and the duration of the stalls due to STLB misses can dramatically decrease throughput. Therefore, it is critical to cache the translations in STLB 522.

An appropriate number of entries to cache in an STLB is the number of pages touched by a vertical traversal of a surface. When the memory used by rows of pixels exceeds VA page sizes, one entry should be cached for each row in the surface.

Sizing the STLB to a number of entries equal to the height of the access region still presents problems:

(A) The flow of rotation reads and writes is interrupted (sometimes for long periods of time) when a row access reaches a new page, causing a STLB miss.

(B) For well aligned surfaces, such as ones where the WIDTH is an integer number of pages, STLB misses occur back-to-back for all row each time a row access reaches a new page. This creates a large burst of traffic from the SMMU walker, delaying pixel traffic for a long time.

According to an aspect of the invention, a translation prefetching mechanism is used in conjunction with an STLB to reduce or eliminate delay due to STLB misses. The STLB receives prefetch commands from the multi-dimension engine (or another coordinated agent) to trigger the walker to fetch a translation in anticipation of its near future use. The walker places the new translation in the STLB so that it is available in advance or in a reduced amount of time after the translation being requested by the multi-dimension engine.

Figure 6:
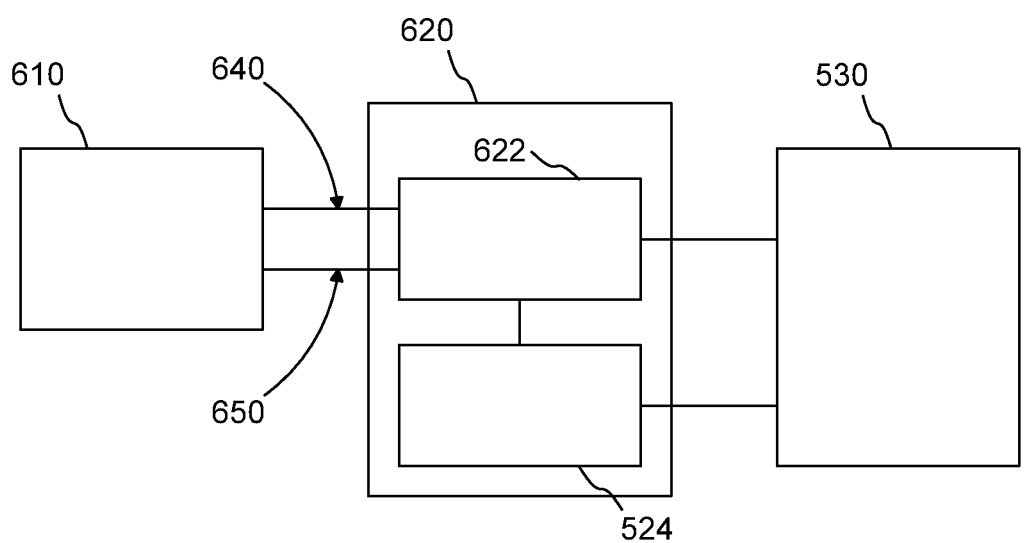
FIG. 6 illustrates another such arrangement having separate channels for data requests and prefetch requests in accordance with the present invention.

FIG. 6 shows multi-dimension engine 610, according to some aspects of the invention, connected through SMMU 620 to memory 530. Multi-dimension engine 610 makes data requests through physical channel 640 and prefetch requests through physical channel 650. According to other aspects of the invention pixel and prefetch requests are sent on a shared physical channel and distinguished by an attribute of the request (e.g. a bit or a command type or reserved request size).

Figure 7:
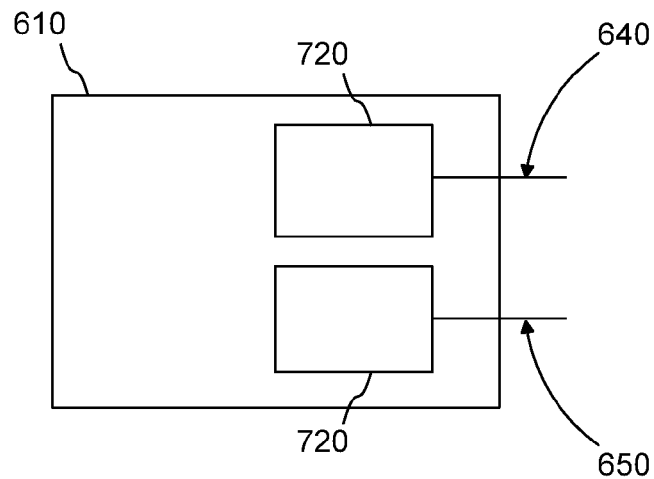
FIG. 7 illustrates two possible arrangements of address generators within a rotation engine in accordance with the present invention.
Figure 7:
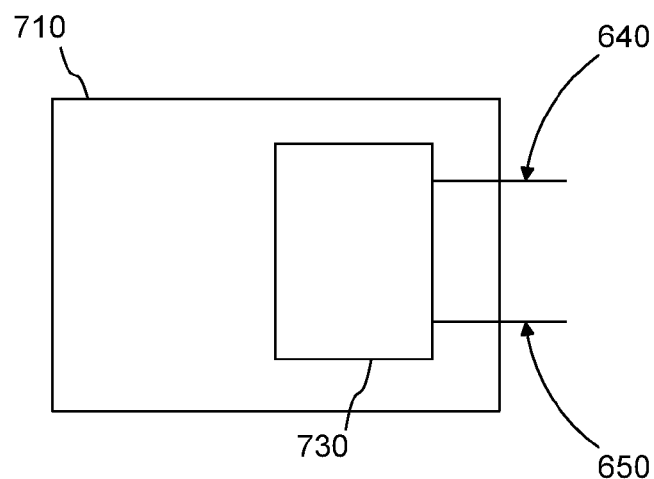

According to some aspects of the invention, as shown in FIG. 7 (a) multi-dimension engine 610 comprises address generator 720, which generates the addresses needed to access the pixels in memory. Address generator 720 is duplicated so that each generator is enabled to generate the same stream of addresses, but will generate them earlier as prefetch requests on channel 650 and later as data requests on channel 640.

According to other aspects of the invention, as shown in FIG. 7 (b) multi-dimension engine 710 comprises address generator 730, which generates an advanced stream of prefetch requests to addresses, ahead of data requests to the same addresses.

According to another aspect of the invention, the prefetch generator is constrained to stay within a certain range of addresses of the regular stream.

According to another aspect of the invention, the distance is one page, so that for any row being accessed the translation for the next page to be encountered may be prefetched, but not the following one.

According to other aspects of the invention, the distance may be set to less than a page or more than a page depending on the buffering and the latency required to cover the walking time of the prefetch requests.

Figure 8:
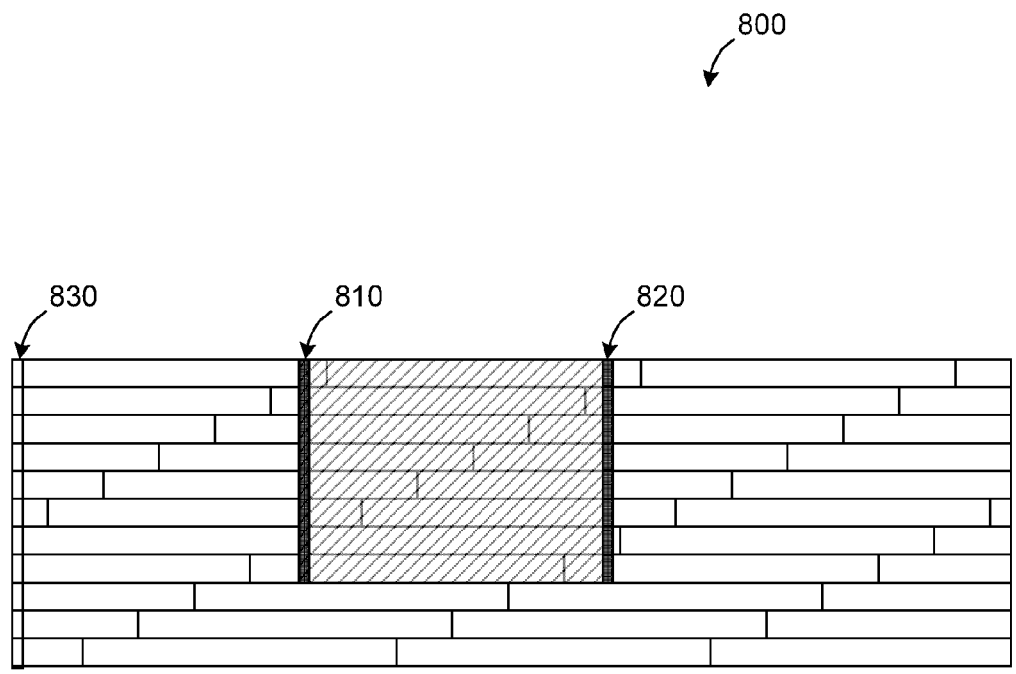
FIG. 8 shows the application of a prefetch window of an access region with lines spread across different pages in accordance with the present invention.

Referring now to FIG. 8, according to an aspect of the invention, surface 800 has row of data, a row comprising 3.125 pages of data. Surface 800 is accessed eight rows at a time with sequential accesses being to rightward data. A raw prefetch address stream comes with all addresses that will be accessed by the regular stream one page-worth of addresses later. At a particular time, data requests are sent for the data in column 810. The raw prefetch stream is sent for the data in prefetch request column 820.

The raw stream is filtered to send just one prefetch per page. In particular, addresses are filtered out if they are not perfectly aligned on a page boundary. Thusly, a prefetch of the next page is sent immediately after the last data element of a previous page is accessed, and need be available for exactly two translations per row.

At the right edge of surface 800, the data access column wraps to the beginning of the next group of eight rows, starting from left edge 830 of the surface. Upon wrapping, each access will cause a translation miss. According to another aspect of the invention, prefetch requests of addresses corresponding to left edge 830 are sent, despite the fact that some (most) are not perfectly aligned to a page boundary. This corresponds to a start condition for a new access region to be transferred when the data on the starting edge of an access region is not aligned to a page boundary.

According to some aspects of the invention, the prefetch traffic is limited so that it does not overwhelm the walker or the memory system. That is, the multi-dimension engine discards or delays the issuance of prefetch requests based on its state. Limits are possible based on bandwidth of prefetch requests, the current number of outstanding prefetch requests, and maximum latency, among others.

According to some aspects of the invention, the STLB is sized to a number of translations equal to twice the height of the fetch access region when the prefetch window is limited to one page of width. This is because the whole prefetch window can only contain two pages (current, next) per row.

According to other aspects of the invention, the STLB is sized to a number of translations equal to 1+(prefetch window width/page size) for the largest page size that is supported by the system.

These settings are optimal in steady state (i.e. when the prefetch window is not touching the edges of the surface). However, when the prefetch window is at the starting edge or straddles access regions there is discontinuity in the pages to prefetch as the new access region typically uses totally different pages.

According to some aspects of the invention, the STLB is sized to 3 times fetch height (for a page-wide prefetch window) or 2+(prefetch window size/page size) times the fetch height for other sizes. This allows the prefetch window to cover 2 different access regions with no interruption in the prefetching.

In unaligned cases, partially used pages at the left of the fetch access region are also used on the previous row at the right of the access region. On a wide enough surface, the page would be replaced in the TLB by the time the prefetch window size reaches the right side of the access region and so the page would have to be prefetched again. Increasing the raw prefetch stream filter size or adding special logic can make the repeated fetching unnecessary.

According to some aspects of the invention, the STLB is sized to 3 times the fetch height (for a page-wide prefetch window) or 2+(prefetch window size/page size) times the fetch height for other sizes and the TLB is filtered to fix the page entries at the start of an access region until reaching the end of the access region.

As will be apparent to those of skill in the art upon reading this disclosure, each of the aspects described and illustrated herein has discrete components and features which may be readily separated from or combined with the features and aspects to form embodiments, without departing from the scope or spirit of the present invention. Any recited method can be carried out in the order of events recited or in any other order which is logically possible.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or system in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein.

In accordance with the teaching of the present invention a computer and a computing device are articles of manufacture. Other examples of an article of manufacture include: an electronic component residing on a mother board, a server, a mainframe computer, or other special purpose computer each having one or more processors (e.g., a Central Processing Unit, a Graphical Processing Unit, or a microprocessor) that is configured to execute a computer readable program code (e.g., an algorithm, hardware, firmware, and/or software) to receive data, transmit data, store data, or perform methods.

The article of manufacture (e.g., computer or computing device) includes a non-transitory computer readable medium or storage that includes a series of instructions, such as computer readable program steps or code encoded therein. In certain aspects of the present invention, the non-transitory computer readable medium includes one or more data repositories. Thus, in certain embodiments that are in accordance with any aspect of the present invention, computer readable program code (or code) is encoded in a non-transitory computer readable medium of the computing device. The processor, in turn, executes the computer readable program code to create or amend an existing computer-aided design using a tool. In other aspects of the embodiments, the creation or amendment of the computer-aided design is implemented as a web-based software application in which portions of the data related to the computer-aided design or the tool or the computer readable program code are received or transmitted to a computing device of a host.

An article of manufacture or system, in accordance with various aspects of the present invention, is implemented in a variety of ways: with one or more distinct processors or microprocessors, volatile and/or non-volatile memory and peripherals or peripheral controllers; with an integrated microcontroller, which has a processor, local volatile and non-volatile memory, peripherals and input/output pins; discrete logic which implements a fixed version of the article of manufacture or system; and programmable logic which implements a version of the article of manufacture or system which can be reprogrammed either through a local or remote interface. Such logic could implement either a control system either in logic or via a set of commands executed by a soft-processor.

Accordingly, the preceding merely illustrates the various aspects and principles of the present invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the various aspects discussed and described herein. Rather, the scope and spirit of present invention is embodied by the appended claims.

What is claimed is:

1. A multi-dimension engine, comprising an interface, wherefrom an address translation prefetch request is sent to a system translation lookaside buffer (STLB), wherein the STLB comprises a number of translations approximately equal to one of two times a height of a fetch access region when a prefetch window width is one page, three times the height of the fetch access region when the prefetch window width is one page, 2+(a prefetch window size/a page size) times the height of the fetch access region, or 1+(the prefetch window width/a maximum page size supported by the multi-dimension engine).

2. The multi-dimension engine of claim 1 comprising an address generator.

3. The multi-dimension engine of claim 1 wherein each page accessed during an access sequence receives no more than one of the address translation prefetch request.

4. The multi-dimension engine of claim 1 wherein the address translation prefetch request is sent only for one address within a page.

5. The multi-dimension engine of claim 4 wherein the one address is aligned on a page boundary.

6. The multi-dimension engine of claim 4 wherein the one address corresponds to a starting boundary of the fetch access region.

7. The multi-dimension engine of claim 1 wherein a data request is subsequently sent to the same page as the address translation prefetch request.

8. The multi-dimension engine of claim 7 wherein the address translation prefetch request is constrained to an address range relative to the data request.

9. The multi-dimension engine of claim 8 wherein the address range is exactly one page.

10. The multi-dimension engine of claim 8 wherein the address range is less than one page.

11. The multi-dimension engine of claim 8 wherein the address range is more than one page.

12. The multi-dimension engine of claim 1 wherein the address translation prefetch request is limited.

13. The multi-dimension engine of claim 12 wherein the limiting is based on a bandwidth.

14. The multi-dimension engine of claim 12 wherein the limiting is based on a number of outstanding prefetch requests.

15. The multi-dimension engine of claim 12 wherein the limiting is based on a maximum latency.

16. A non-transitory computer-readable storage medium arranged to represent Hardware Description Language (HDL) source code, the HDL source code representing a multi-dimension engine, comprising an interface, wherefrom an address translation prefetch request is sent to a system translation lookaside buffer (STLB), wherein the STLB comprises a number of translations approximately equal to one of two times a height of a fetch access region when a prefetch window width is one page, three times the height of the fetch access region when the prefetch window width is one page, 2+(a prefetch window size/a page size) times the height of the fetch access region, or 1+(the prefetch window width/a maximum page size supported by the multi-dimension engine).

17. A system translation lookaside buffer (STLB) comprising a number of translations approximately equal to two times a height of a fetch access region when a prefetch window width is one page.

18. A system translation lookaside buffer (STLB) comprising a number of translations approximately equal to three times a height of a fetch access region when a prefetch window width is one page.

19. A system translation lookaside buffer (STLB) comprising a number of translations approximately equal to 1+(a prefetch window width/a maximum page size supported by a multi-dimension engine).

20. A system translation lookaside buffer (STLB) filtered to fix page entries at a start of an access region until reaching an end of the access region, wherein the STLB comprises a number of translations approximately equal to one of two times a height of a fetch access region when a prefetch window width is one page, three times the height of the fetch access region when the prefetch window width is one page, 2+(a prefetch window size/a page size) times the height of the fetch access region, or 1+(the prefetch window width/a maximum page size supported by the STLB).

21. A non-transitory computer-readable medium arranged to represent Hardware Description Language (HDL) source code, the HDL source code representing a system translation lookaside buffer (STLB), wherein the STLB comprises a number of translations approximately equal to at least one of: two times a height of a fetch access region when a prefetch window width is one page, three times the height of the fetch access region when the prefetch window width is one page, 2+(a prefetch window size/a page size) times the height of the fetch access region, or 1+(the prefetch window width/a maximum page size supported by a multi-dimension engine).

22. A method for accessing a data set comprising issuing a translation prefetch from a multi-dimension engine to a system translation lookaside buffer (STLB), wherein the STLB comprises a number of translations approximately equal to one of two times a height of a fetch access region when a prefetch window width is one page, three times the height of the fetch access region when the prefetch window width is one page, 2+(a prefetch window size/a page size) times the height of the fetch access region, or 1+(the prefetch window width /a maximum page size supported by the multi-dimension engine).

* * * * *